(12) United States Patent
Mochizuki et al.

(10) Patent No.: US 7,518,295 B2
(45) Date of Patent: Apr. 14, 2009

(54) MULTILAYER PIEZOELECTRIC ELEMENT

(75) Inventors: Kazuo Mochizuki, Tokyo (JP); Kazuo Nagata, Tokyo (JP); Yuzo Sawara, Tokyo (JP)

(73) Assignee: TDK Corporation, Tokyo (JP)

( * ) Notice: Subject to any disclaimer, the term of this patent is extended or adjusted under 35 U.S.C. 154(b) by 29 days.

(21) Appl. No.: 11/907,904

(22) Filed: Oct. 18, 2007

(65) Prior Publication Data
US 2008/0136293 A1 Jun. 12, 2008

(51) Int. Cl.
*H01L 41/083* (2006.01)
(52) U.S. Cl. ..................................................... 310/366
(58) Field of Classification Search ................. 310/328, 310/366
See application file for complete search history.

(56) References Cited

U.S. PATENT DOCUMENTS 5,163,209 A * 11/1992 Harada et al. .............. 29/25.35
5,175,465 A * 12/1992 Um et al. ................... 310/328
2006/0138908 A1* 6/2006 Iwase et al. ................ 310/366

FOREIGN PATENT DOCUMENTS

JP A 05-243635 9/1993

* cited by examiner

*Primary Examiner*—Thomas M Dougherty
(74) *Attorney, Agent, or Firm*—Oliff & Berridge, PLC (57) ABSTRACT

A multilayer piezoelectric element has a laminate body in which a plurality of piezoelectric bodies and a plurality of internal electrodes are alternately laminated and sintered. The plurality of internal electrodes comprise a first electrode and a second electrode. The laminate body is provided with a metal oxide layer formed of a material with a melting point higher than a sintering temperature of the piezoelectric bodies. The laminate body has an active portion in which the first electrode and the second electrode are arranged to overlap in a laminate direction of the laminate body, and inactive portions in which the first electrode and the second electrode are arranged not to overlap in the laminate direction of the laminate body. The inactive portions are provided on both sides of the active portion. The metal oxide layer has a first region formed in the same layer as the internal electrode in the inactive portion, and a second region formed so as to extend from the first region toward the active portion and overlap the internal electrode.

4 Claims, 8 Drawing Sheets

MULTILAYER PIEZOELECTRIC ELEMENT

BACKGROUND OF THE INVENTION

1. Field of the Invention

The present invention relates to a multilayer piezoelectric element used in a fuel injection device or the like.

2. Related Background Art

A conventionally known multilayer piezoelectric element is, for example, the one described in Japanese Patent Application Laid-Open No. 5-243635. The multilayer piezoelectric element described in the Laid-Open No. 5-243635 has a laminate body in which piezoelectric bodies and internal electrodes are alternately laminated, and external electrodes provided on side faces of this laminate body and connected to the internal electrodes. Metal oxide layers (alumina layers) for relaxing stress concentration occurring in the laminate body during driving of the element are provided in the same layers as the internal electrodes in the laminate body.

SUMMARY OF THE INVENTION

When the metal oxide layers were provided simply in the same layers as the internal electrodes in the laminate body as in the above-described conventional technology, it was, however, sometimes the case that occurrence of cracks extending in the laminate direction of the laminate body was not avoided during the driving of the element. In this case, a short circuit could occur between the internal electrodes of different polarities and bring about dielectric breakdown of the element.

An object of the present invention is to provide a multilayer piezoelectric element capable of surely preventing the occurrence of cracks extending in the laminate direction of the laminate body.

The present invention provides a multilayer piezoelectric element comprising a laminate body in which a plurality of piezoelectric bodies and a plurality of internal electrodes are alternately laminated and sintered, wherein the plurality of internal electrodes comprise a first electrode and a second electrode, wherein the laminate body is provided with a metal oxide layer formed of a material with a melting point higher than a sintering temperature of the piezoelectric bodies, wherein the laminate body has: an active portion in which the first electrode and the second electrode are arranged to overlap in a laminate direction of the laminate body; and inactive portions which are provided on both sides of the active portion and in which the first electrode and the second electrode are arranged not to overlap in the laminate direction of the laminate body, wherein the metal oxide layer has: a first region formed in the same layer as the internal electrode in the inactive portion; and a second region formed so as to extend from the first region toward the active portion and overlap the internal electrode. "The same layer as the internal electrode" stated herein is not limited only to perfectly the same layer as the internal electrode, but also includes approximately the same layer as the internal electrode.

In the multilayer piezoelectric element of the present invention as described above, when a voltage is applied between the first electrode and the second electrode, an electric field is produced between them to displace portions of the piezoelectric bodies existing in the active portion, in the laminate direction of the laminate body. At this time, stress due to the displacement of the piezoelectric bodies acts on the laminate body. However, the laminate body is provided with the metal oxide layer formed of the material with the melting point higher than the sintering temperature of the piezoelectric bodies. This metal oxide layer is not fully sintered in comparison with the piezoelectric bodies, during firing of the laminate body in a production process of the element. As a result, the metal oxide layer has strength lower than the piezoelectric bodies. Such a metal oxide layer has the first region formed in the same layer as the internal electrode in the inactive portion of the laminate body, and the second region formed so as to extend from this first region toward the active portion and overlap the internal electrode. Namely, the metal oxide layer extends fully up to the interface between the piezoelectric body and the internal electrode, but the interface is weak in strength. Therefore, during the aforementioned displacement of the element, the metal oxide layer relaxes stress concentration on the laminate body and cracks (lateral cracks) are likely to run along the interface between the piezoelectric body and the internal electrode. This can surely prevent occurrence of cracks (vertical cracks) extending in the laminate direction of the laminate body.

Preferably, the second region is formed so as to overlap a part of the internal electrode. In this case, the material making up the metal oxide layer does not have to be used more than necessary. Therefore, this allows us to save material cost of the metal oxide layer and reduce the time necessary for production of the multilayer piezoelectric element.

The second region may be formed so as to overlap the entire internal electrode. In this case, the strength of the interface becomes much weaker between the piezoelectric body and the internal electrode, and therefore lateral cracks become more likely to run along the interface between the piezoelectric body and the internal electrode.

Preferably, the piezoelectric bodies are formed of a piezoelectric material whose principal ingredient is lead zirconate titanate, and the metal oxide layer is formed of a material containing at least one of $ZrO_2$, $MgO$, $Nb_2O_5$, $Ta_2O_5$, $CeO_2$, and $Y_2O_3$.

$ZrO_2$, $MgO$, $Nb_2O_5$, $Ta_2O_5$, $CeO_2$, and $Y_2O_3$ are materials which have the melting point higher than the sintering temperature of lead zirconate titanate and which are soluble in the lead zirconate titanate. Therefore, when such a material is used for the metal oxide layer, a component of the metal oxide layer becomes less likely to separate out in grain boundaries of the piezoelectric bodies during the firing of the laminate body and it suppresses increase in the number of grain boundaries per unit thickness in the piezoelectric bodies. This is believed to suppress thermal loss occurring in grain boundaries of the piezoelectric bodies when a voltage (electric field) is applied between the first electrode and the second electrode. Therefore, a desired displacement against the applied electric field can be achieved upon displacement of the element. The decrease in the number of grain boundaries per unit thickness in the piezoelectric bodies makes vertical cracks less likely to occur in the laminate body.

The present invention surely prevents the occurrence of cracks extending in the laminate direction of the laminate body and improves durability of the multilayer piezoelectric element.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the multilayer piezoelectric element according to the present invention will be described below in detail with reference to the drawings.

Figure 1:
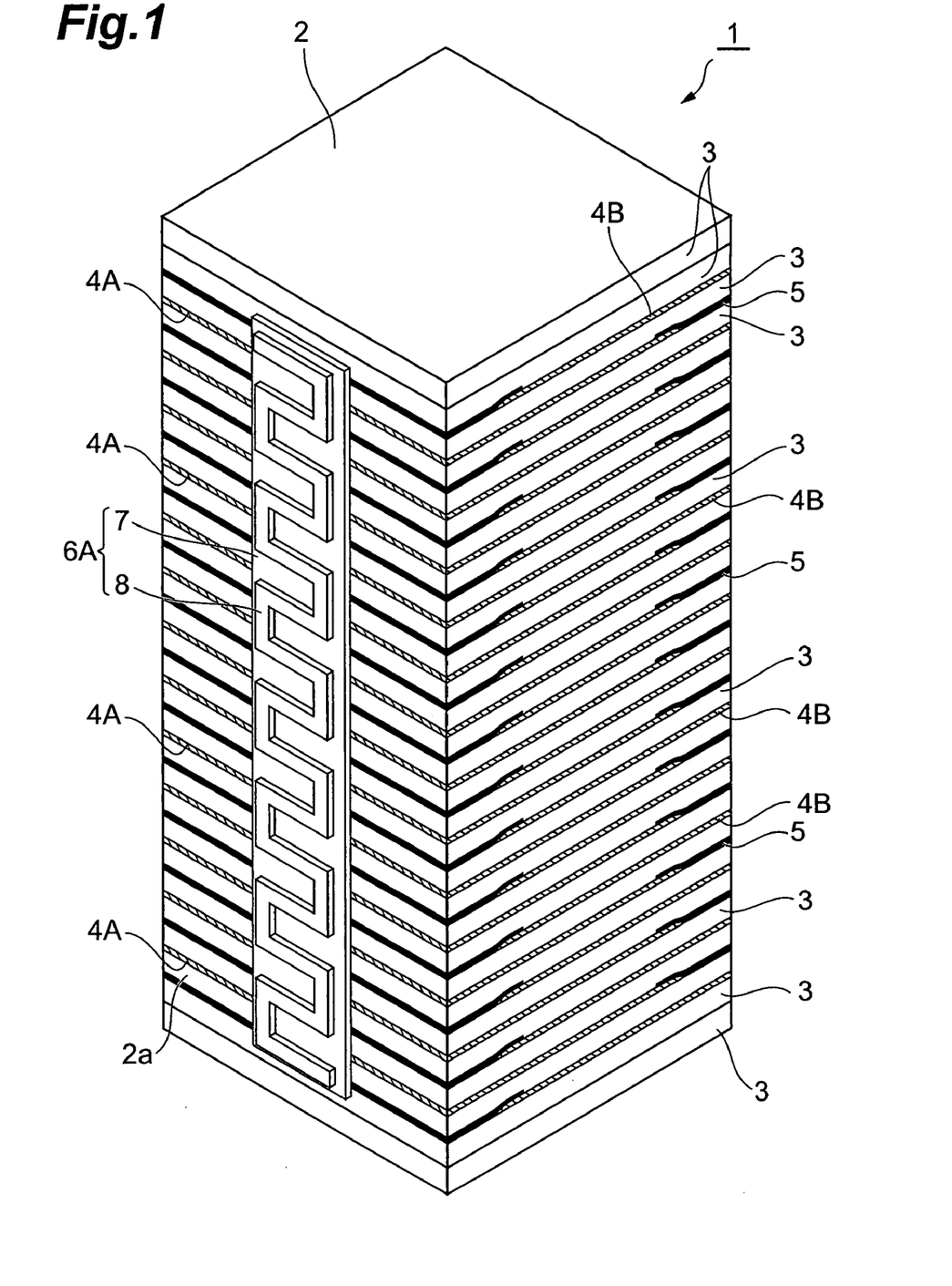
FIG. 1 is a perspective view showing a multilayer piezoelectric element according to the first embodiment.
Figure 2:
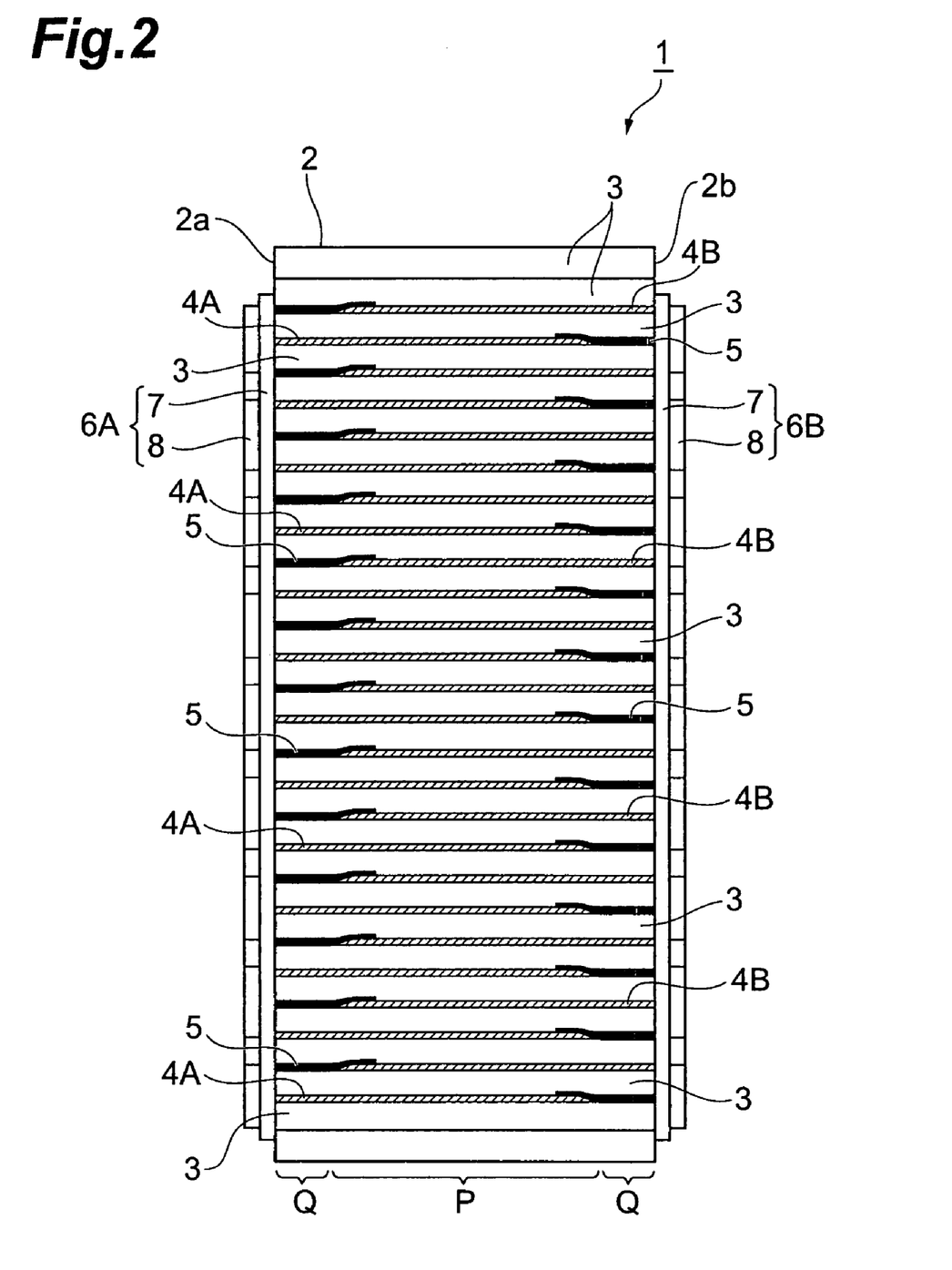
FIG. 2 is a side view of the multilayer piezoelectric element shown in FIG. 1.
Figure 3:
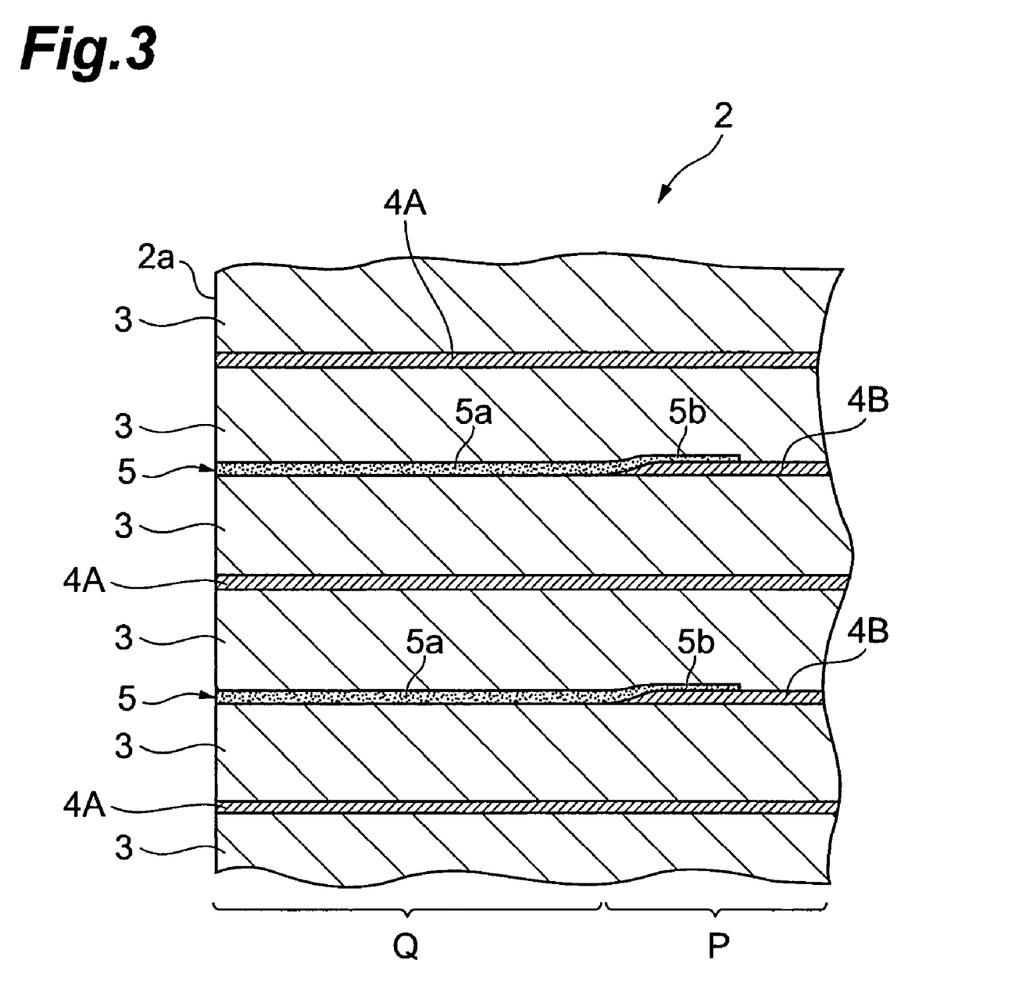
FIG. 3 is a partly enlarged sectional view showing a layer structure of a laminate body shown in FIG. 1.

FIG. 1 is a perspective view showing the multilayer piezoelectric element according to the first embodiment, FIG. 2 a side view of the multilayer piezoelectric element shown in FIG. 1, and FIG. 3 a partly enlarged sectional view showing a layer structure of the multilayer piezoelectric element shown in FIG. 1. In each drawing, the multilayer piezoelectric element 1 of the present embodiment is one used, for example, in a fuel injection device of an internal combustion engine mounted on an automobile.

The multilayer piezoelectric element 1 has a laminate body 2 of quadrangular prism shape. The laminate body 2 is formed by laminating a plurality of piezoelectric bodies 3 and a plurality of internal electrodes 4A, 4B in a predetermined order and sintering them. The dimensions of the laminate body 2 are, for example, width 10 mm×depth 10 mm×height 35 mm.

The piezoelectric bodies 3 are made, for example, of a piezoelectric ceramic material whose main ingredient is PZT (lead zirconate titanate). The thickness of the piezoelectric bodies 3 is, for example, approximately 80-100 µm per layer. The composition of PZT used herein is, for example, as follows.

Pb0.999[($Zn_{1/3}Nb_{2/3}$)0.11 Ti0.425 Zr0.465]$O_3$+ 0.2 wt % $Fe_2O_3$+0.2 wt % $Sb_2O_3$

The powder characteristics of PZT employed herein are, for example, the BET specific surface area of about 2.5 m²/g and the average particle size of about 0.6 µm. The sintering temperature of PZT is about 950° C. The melting point of PZT-based materials is about 1300° C.

The internal electrodes 4A, 4B are made, for example, of an electroconductive material whose principal ingredients are Ag and Pd. The thickness of the internal electrodes 4A, 4B is, for example, approximately 2 µm. The internal electrodes 4A, 4B are alternately laminated with a piezoelectric body 3 in between. One end of each internal electrode 4A is exposed in one side face 2a of the laminate body 2 and the other end of the internal electrode 4A is located inside the other side face 2b of the laminate body 2. One end of each internal electrode 4B is exposed in the side face 2b of the laminate body 2 and the other end of the internal electrode 4B is located inside the side face 2a of the laminate body 2. This arrangement causes parts of the internal electrodes 4A, 4B to overlap each other in the laminate direction of the laminate body 2.

In the laminate body 2, the portions where the internal electrodes 4A, 4B overlap in the laminate direction constitute an active portion P in which the piezoelectric bodies 3 are displaced with application of a voltage to the internal electrodes 4A, 4B. In the laminate body 2, the portions where the internal electrodes 4A, 4B do not overlap in the laminate direction (i.e., the two side ends of the laminate body 2) constitute inactive portions Q in which the piezoelectric bodies 3 are not displaced with application of the voltage to the internal electrodes 4A, 4B.

In the laminate body 2 a plurality of metal oxide layers 5 are formed of an electrical insulating material with the density (strength) lower than that of the piezoelectric bodies 3. Each metal oxide layer 5 consists of an isolayer region 5a formed in the same layer as the internal electrode 4A, 4B in the inactive portion Q, and an overlap region 5b formed so as to extend from the isolayer region 5a toward the active portion P and overlap a part of the upper surface of the internal electrode 4A, 4B. The isolayer region 5a located in the same layer as the internal electrode 4A is exposed in the side face 2b of the laminate body 2. The isolayer region 5a located in the same layer as the internal electrode 4B is exposed in the side face 2a of the laminate body 2. Namely, each metal oxide layer 5 extends from the side face 2a, 2b of the laminate body 2 up to the active portion P so as to contact the internal electrode 4A, 4B. The thickness of the isolayer region 5a is, for example, equal to the thickness of the internal electrode 4A, 4B.

The metal oxide layers 5 are made of a material which has the melting point higher than the sintering temperature of PZT being the principal ingredient of the piezoelectric bodies 3 and which is soluble in PZT. Such materials include materials containing at least one of $ZrO_2$, MgO, $Nb_2O_5$, $Ta_2O_5$, $CeO_2$, and $Y_2O_3$. The metal oxide layers 5 and the piezoelectric bodies 3 are made of their respective materials of mutually different composition systems. The melting points of $ZrO_2$, MgO, $Nb_2O_5$, $Ta_2O_5$, $CeO_2$, and $Y_2O_3$ are approximately 1500-2800° C.

An external electrode 6A electrically connected to each internal electrode 4A is disposed on the side face 2a of the laminate body 2, and an external electrode 6B electrically connected to each internal electrode 4B is disposed on the side face 2b of laminate body 2.

Each external electrode 6A, 6B has an electrode portion 7 of rectangular plate shape and a corrugated electrode portion 8. The electrode portions 7 extend in the laminate direction of the laminate body 2 so as to cover the center region of the side faces 2a, 2b, respectively, of the laminate body 2. The electrode portions 8 are located outside the electrode portions 7 and extend in the laminate direction of the laminate body 2. Each electrode portion 8 is bonded to the corresponding electrode portion 7 so as to have a stretch property (flexibility) in the laminate direction of the laminate body 2. The electrode portions 7 are made, for example, of an electroconductive material whose principal ingredient is any one of Ag, Au, and Cu. The electrode portions 8 are made, for example, of Cu, a Cu alloy, Ni, an Ni alloy, a flexible board, or the like.

A method of producing the above-described multilayer piezoelectric element 1 will be described below. First, an organic binder resin, an organic solvent, etc. are mixed in a ceramic powder whose principal ingredient is PZT, to prepare a paste for green sheets. Then the paste for green sheets is applied onto a carrier film (not shown), for example, by the doctor blade method to form a plurality of green sheets 9 for formation of the aforementioned piezoelectric bodies 3.

Figure 4:
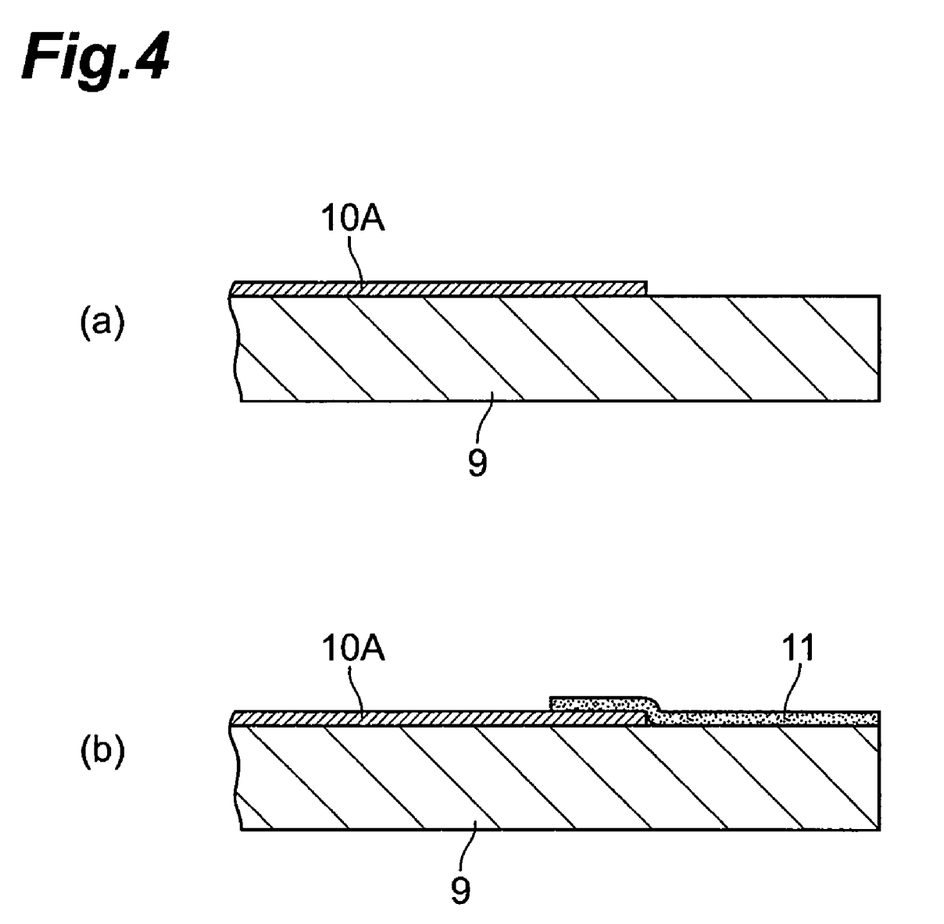
FIG. 4 is a drawing showing steps of forming an electrode pattern and a $ZrO_2$ paste layer over a green sheet, in production of the multilayer piezoelectric element shown in FIG. 1.

Subsequently, an organic binder resin, an organic solvent, etc. are mixed in an electroconductive material to prepare a paste for electrode patterns. The electroconductive material contains Ag and Pd and, for example, can be prepared at the ratio of Ag:Pd=85:15. Then the paste for electrode patterns is printed, for example, by screen printing, as shown in FIG. 4(a), to form electrode patterns 10A, 10B corresponding to the aforementioned internal electrodes 4A, 4B, on the respective individual green sheets 9. At this time, the electrode patterns 10A, 10B are formed in regions except for one-end-side portions corresponding to the inactive portions Q on the upper surfaces of the green sheets 9.

Furthermore, an organic binder resin, an organic solvent, etc. are mixed, for example, in a ceramic powder containing $ZrO_2$ powder, to prepare a $ZrO_2$ paste. Particle sizes of the $ZrO_2$ powder used herein are preferably larger than particle sizes of the piezoelectric material powder (ceramic powder) and smaller than the thickness of the electrode patterns 10A, 10B.

Then the $ZrO_2$ paste is printed, for example, by screen printing, as shown in FIG. 4(b), to form a $ZrO_2$ paste layer 11 on the green sheet 9 and on the electrode pattern 10A, 10B. At this time, the $ZrO_2$ paste layer 11 is formed in an electrode-unprinted region without print of the electrode pattern 10A, 10B (the region corresponding to the aforementioned inactive portion Q) on the upper surface of each green sheet 9 and the $ZrO_2$ paste layer 11 is also formed so as to overlap the end region on the electrode-unprinted region side on the upper surface of each electrode pattern 10A, 10B.

Figure 5:
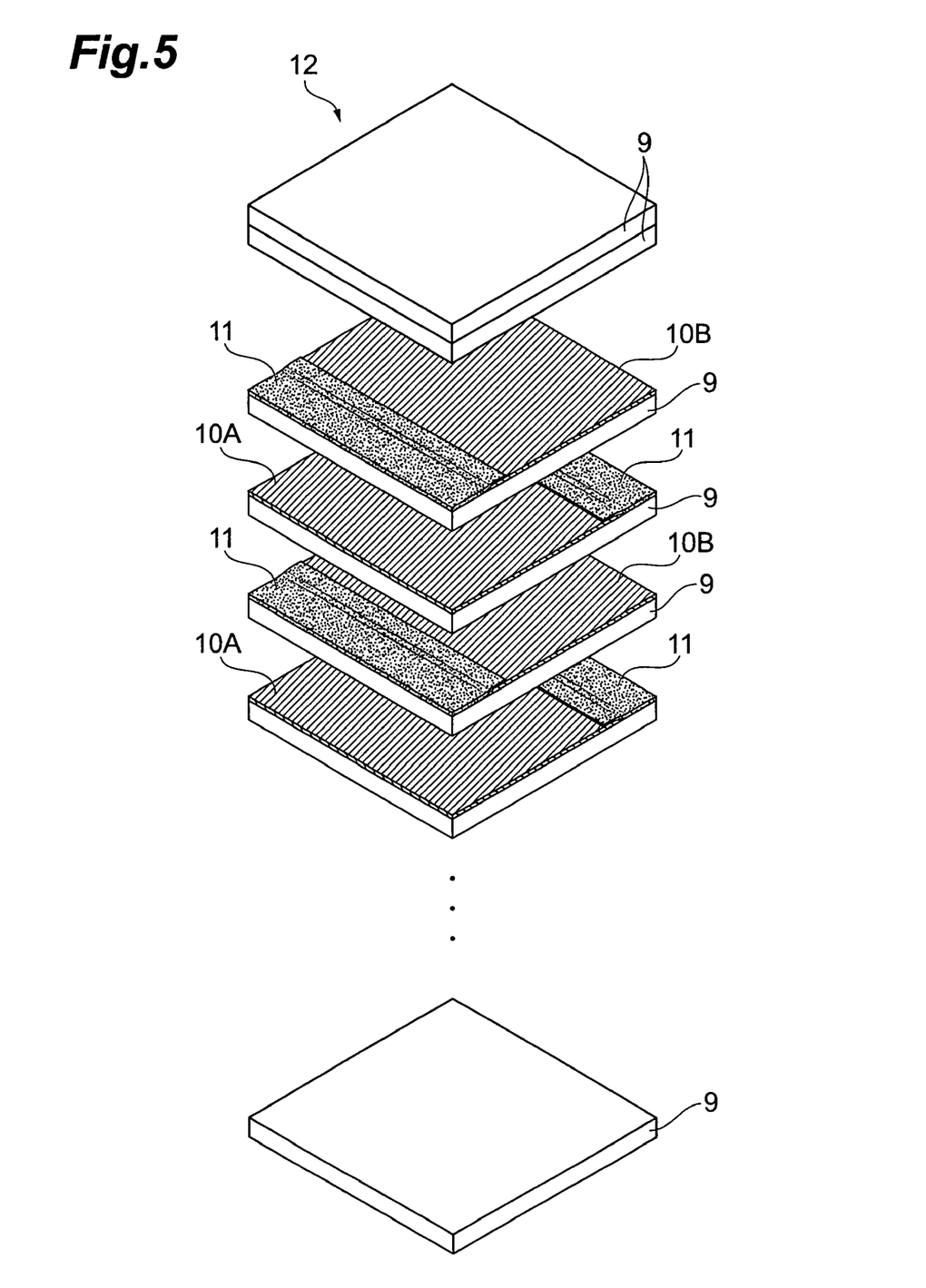
FIG. 5 is an exploded perspective view of a green laminate body obtained by laminating plural types of green sheets including those as shown in FIG. 4.

Subsequently, as shown in FIG. 5, the green sheets 9 with the electrode pattern 10A and $ZrO_2$ paste layer 11, and the green sheets 9 with the electrode pattern 10B and $ZrO_2$ paste layer 11 are laminated in a predetermined order. Furthermore, a predetermined number of green sheets 9 without electrode patterns 10A, 10B nor $ZrO_2$ paste layer 11 are laminated as protecting layers in the outermost layers. This forms a green laminate body 12.

Subsequently, the green laminate body 12 is pressed in the laminate direction while being heated at the temperature of about 60° C. Thereafter, the green laminate body 12 is cut in a predetermined size, for example, with a diamond blade to obtain a chip.

Then the green laminate body 12 after cut is mounted on a setter (not shown) and a degreasing (debindering) process of the green laminate body 12 is carried out at the temperature of about 400° C. for about ten hours. Then the degreased green laminate body 12 is put in a sagger furnace and the green laminate body 12 is fired, for example, at the temperature of 950-1000° C. for about two hours. This results in sintering the green sheets 9, electrode patterns 10A, 10B, and $ZrO_2$ paste layers 11 and obtaining the laminate body 2 as a sintered body.

At this time, since the $ZrO_2$ paste layers 11 are made of the material of the composition system, different from that of the green sheets 9, sintering reactivity is suppressed between the $ZrO_2$ paste layers 11 and the green sheets 9, without occurrence of unwanted chemical reaction between them. In addition, since the melting point of the $ZrO_2$ paste layers 11 is higher than the sintering temperature of the green sheets 9, the $ZrO_2$ paste layers 11 are less likely to be sintered than the green sheets 9. For this reason, after the sintering step, the $ZrO_2$ paste layers 11 become the metal oxide layers 5 with low bond strength to the piezoelectric bodies 3.

Each metal oxide layer 5 has the isolayer region 5a and overlap region 5b as described above. However, constriction of the green laminate body 12 due to the firing makes the thickness of the overlap region 5b over the internal electrode 4A, 4B, smaller than the thickness of the isolayer region 5a.

Next, the external electrodes 6A, 6B are formed on the side faces 2a, 2b, respectively, of the laminate body 2. Specifically, for example, an electroconductive paste whose principal ingredient is Ag is printed by screen printing on the side faces 2a, 2b of the laminate body 2 and a baking treatment is carried out, for example, at the temperature of about 700° C. to form the electrode portions 7 on the side faces 2a, 2b of the laminate body 2. The electrode portions 7 may also be formed by any other method such as sputtering or electroless plating. Then the corrugated electrode portions 8 are bonded to the respective electrode portions 7, for example, by soldering.

Finally, a polarization process is carried out by applying a predetermined voltage, for example, at the temperature of 120° C., for example, for three minutes so that the intensity of the electric field in the thickness direction of the piezoelectric bodies 3 becomes about 2 kV/mm. The above completes the multilayer piezoelectric element 1 as shown in FIGS. 1 to 3.

In the multilayer piezoelectric element 1 produced in this manner, when a voltage is applied between the external electrodes 6A, 6B, the voltage is applied between the internal electrodes 4A, 4B connected to the external electrodes 6A, 6B, to produce an electric field between them, whereby the portions of the piezoelectric bodies 3 in the active portion P are displaced in the laminate direction of the laminate body 2.

At this time, stress appears in the borders between the active portion P and the inactive portions Q in the laminate body 2. Since the plurality of metal oxide layers 5 are formed in the inactive portions Q, the stress on the laminate body 2 is concentrated on the ends on the isolayer region 5a side of the metal oxide layers 5. Therefore, cracks extending in the laminate direction of the laminate body 2 (vertical cracks) are less likely to occur.

Each metal oxide layer 5 has the isolayer region 5a formed in the same layer as the internal electrode 4A, 4B in the inactive portion Q of the laminate body 2, and the overlap region 5b formed so as to extend from this isolayer region 5a toward the active portion P and overlap on the internal electrode 4A, 4B. Namely, each metal oxide layer 5 extends from the side face 2a, 2b of the laminate body 2 to the interface between the piezoelectric body 3 and the internal electrode 4A, 4B. The piezoelectric bodies 3 are made of the piezoelectric ceramic material whose principal ingredient is PZT, and the internal electrodes 4A, 4B are made of the electroconductive material; therefore, the adhesive force is weak between the piezoelectric bodies 3 and the internal electrodes 4A, 4B and the interfaces between them are low in strength. Therefore, when the voltage is applied between the external electrodes 6A, 6B to drive (displace) the multilayer piezoelectric element 1, cracks (lateral cracks) are likely to run along the interfaces between the piezoelectric bodies 3 and the internal electrodes 4A, 4B. For this reason, vertical cracks become more unlikely to occur in the laminate body 2.

During the aforementioned polarization process stress is also produced in the laminate body 2 because of application of the electric field, but the existence of the metal oxide layers 5 makes vertical cracks less likely to occur in the laminate body 2, as during the driving of the multilayer piezoelectric element 1.

Incidentally, if the material for making up the metal oxide layers 5 is a material that reacts with the Pb-based material to form a liquid phase, e.g., like $Al_2O_3$, $SiO_2$, or $P_2O_5$, these materials are not dissolved in PZT and are likely to form grain boundaries. Therefore, for example, when the green laminate body including $Al_2O_3$ paste layers is fired, $Al_2O_3$ separates out in grain boundaries of the green sheets 9. For this reason, it impedes growth of particles of PZT and increases the number of grain boundaries per unit thickness in the green sheets 9. In this case, when the electric field is applied between the internal electrodes 4A, 4B in the multilayer piezoelectric element after produced, thermal loss occurs because of the grain boundaries of the piezoelectric bodies 3. This could result in failing to achieve sufficient displacement of the piezoelectric bodies 3 against the applied electric field.

In the present embodiment the material to be soluble in PZT, such as $ZrO_2$, MgO, $Nb_2O_5$, $Ta_2O_5$, $CeO_2$, or $Y_2O_3$, is used as the material for making up the metal oxide layers 5. For this reason, the component such as $ZrO_2$ does not separate out in the grain boundaries of the green sheets 9 during the firing of the green laminate body 12, and this facilitates growth of particles of PZT and suppresses increase in the number of grain boundaries per unit thickness in the green sheets 9. Therefore, the thermal loss due to grain boundaries in the piezoelectric bodies 3 is reduced when the electric field is applied between the internal electrodes 4A, 4B in the multilayer piezoelectric element 1 after produced. This results in achieving sufficient displacement of the piezoelectric bodies 3 against the applied electric field and thus ensuring a desired piezoelectric property.

Since the number of grain boundaries per unit thickness is reduced in the piezoelectric bodies 3, cracks are prevented from running in random directions along grain boundaries in the piezoelectric bodies 3. This also makes vertical cracks less likely to occur in the laminate body 2.

In the present embodiment, as described above, the vertical cracks are prevented from occurring in the laminate body 2 during the driving and the polarization process of the multilayer piezoelectric element 1. This prevents a short circuit between the internal electrodes 4A, 4B and thus avoids dielectric breakdown of the multilayer piezoelectric element 1. It is also feasible to suppress degradation of the piezoelectric property of the multilayer piezoelectric element 1. As a result, it is feasible to improve the durability and performance of the multilayer piezoelectric element 1.

Figure 6:
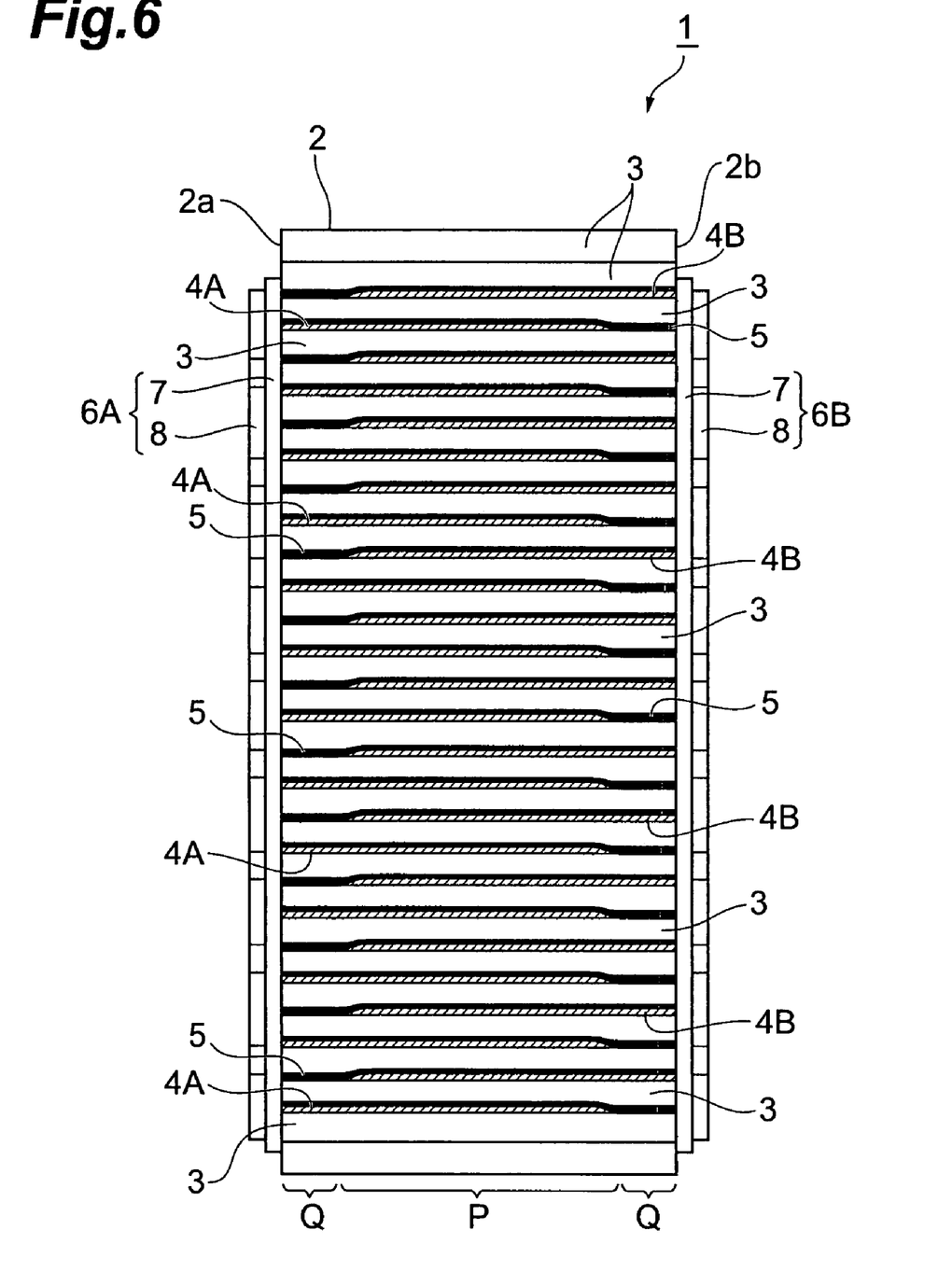
FIG. 6 is a side view showing a multilayer piezoelectric element according to the second embodiment.
Figure 7:
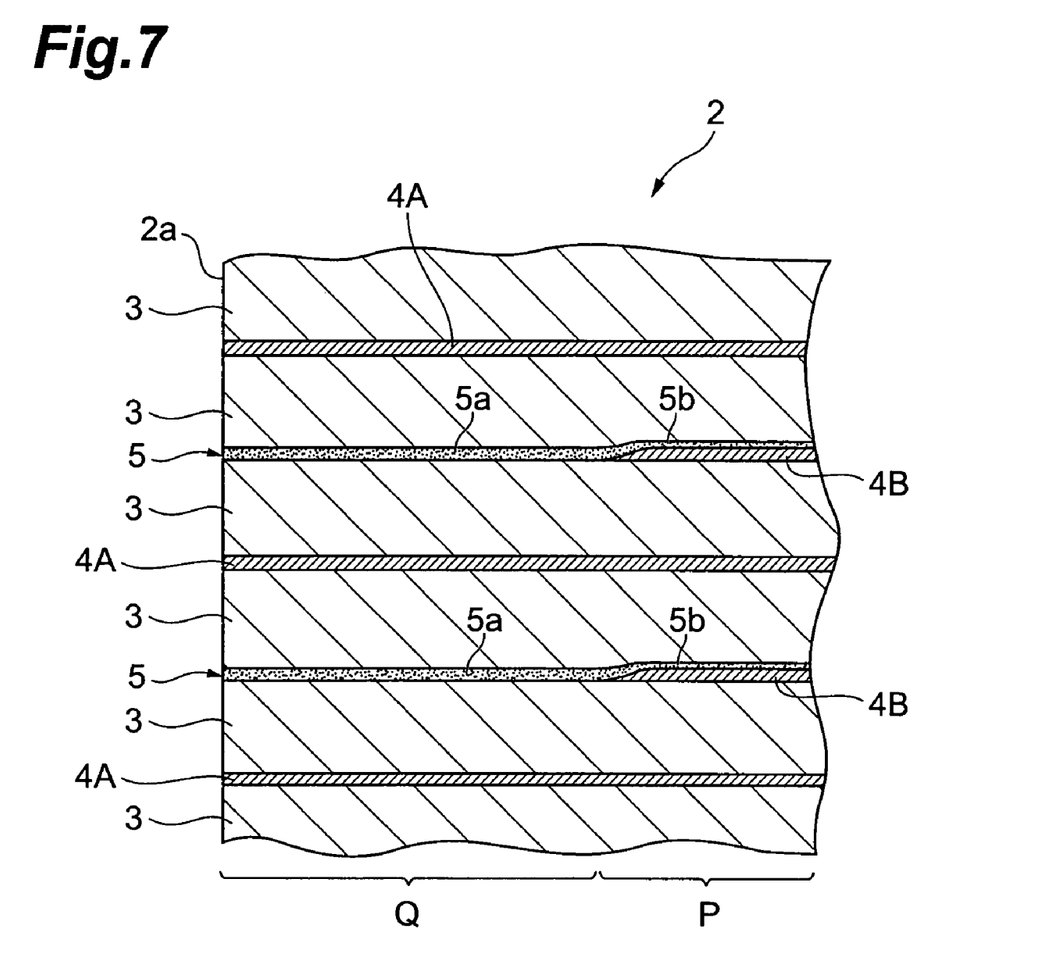
FIG. 7 is a partly enlarged sectional view showing a layer structure of a laminate body shown in FIG. 6.
Figure 8:
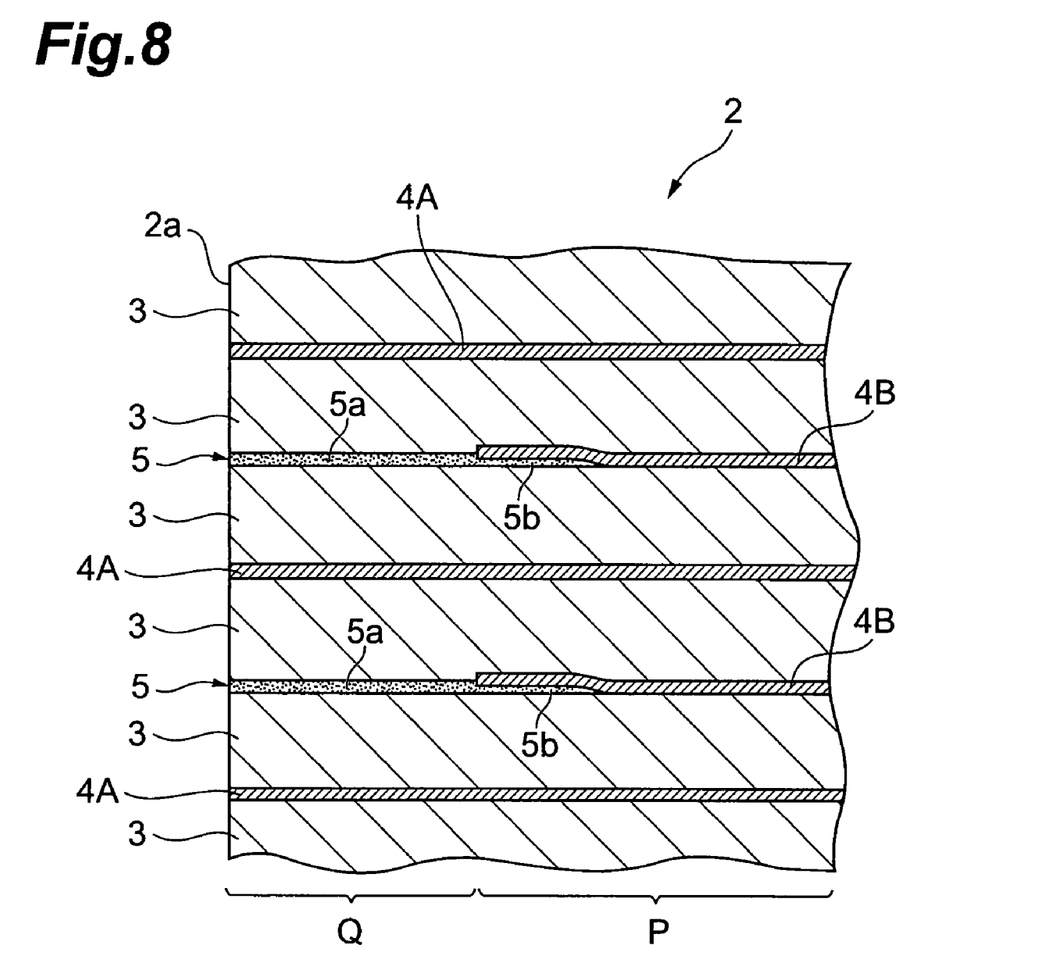
FIG. 8 is a partly enlarged sectional view showing a modification example of the layer structure of the laminate body.

FIG. 6 is a side view of the multilayer piezoelectric element according to the second embodiment and FIG. 7 a partly enlarged sectional view showing a layer structure of the multilayer piezoelectric element shown in FIG. 6. In the drawings identical or equivalent elements to those in the first embodiment will be denoted by the same reference symbols, without redundant description.

In each drawing, the multilayer piezoelectric element 1 of the present embodiment has the laminate body 2 consisting of the piezoelectric bodies 3, internal electrodes 4A, 4B, and metal oxide layers 5 as in the first embodiment. Each metal oxide layer 5 consists of an isolayer region 5a formed in the same layer as the internal electrode 4A, 4B in the inactive portion Q of the laminate body 2, and an overlap region 5b formed so as to extend from this isolayer region 5a toward the active portion P and overlap the entire upper surface of the internal electrode 4A, 4B. Namely, each metal oxide layer 5 extends from the side face 2a to the side face 2b of the laminate body 2 so as to contact the internal electrode 4A, 4B.

For forming the metal oxide layers 5 of this configuration, as shown in FIG. 4(a) described above, the electrode pattern 10A, 10B is first formed in a partial region on the upper surface of each green sheet 9, thereafter, for example, the aforementioned $ZrO_2$ paste is printed by screen printing to form the $ZrO_2$ paste layer 11 (cf. FIG. 4) on the electrode-unprinted region of the upper surface of the green sheet 9 and on the entire upper surface of the electrode pattern 10A, 10B. Thereafter, laminating, pressing, cutting, debindering, and firing are successively carried out in the same manner as in the first embodiment.

In the present embodiment of this configuration, occurrence of vertical cracks in the laminate body 2 can also be prevented during the driving and the polarization process of the multilayer piezoelectric element 1, and this leads to improvement in the durability of the multilayer piezoelectric element 1.

It is noted that the present invention is by no means limited to the above embodiments. For example, the above embodiments showed the configurations wherein the overlap region 5b of each metal oxide layer 5 overlapped over the internal electrode 4A, 4B, but it is also possible to adopt a configuration wherein at least a part of the internal electrode 4A, 4B overlaps over the overlap region 5b of the metal oxide layer 5.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multilayer piezoelectric element comprising a laminate body in which a plurality of piezoelectric bodies and a plurality of internal electrodes are alternately laminated and sintered, wherein the plurality of internal electrodes comprise a first electrode and a second electrode, wherein the laminate body is provided with a metal oxide layer formed of a material with a melting point higher than a sintering temperature of the piezoelectric bodies, wherein the laminate body has:

an active portion in which the first electrode and the second electrode are arranged to overlap in a laminate direction of the laminate body; and inactive portions which are provided on both sides of the active portion and in which the first electrode and the second electrode are arranged not to overlap in the laminate direction of the laminate body, wherein the metal oxide layer has:

a first region formed in the same layer as the internal electrode in the inactive portion; and a second region formed so as to extend from the first region toward the active portion and overlap the internal electrode.

2. The multilayer piezoelectric element according to claim 1, wherein the second region is formed so as to overlap a part of the internal electrode.

3. The multilayer piezoelectric element according to claim 1, wherein the second region is formed so as to overlap the entire internal electrode.

4. The multilayer piezoelectric element according to claim 1, wherein the piezoelectric bodies are formed of a piezoelectric material whose principal ingredient is lead zirconate titanate, and wherein the metal oxide layer is formed of a material containing at least one of $ZrO_2$, MgO, $Nb_2O_5$, $Ta_2O_5$, $CeO_2$, and $Y_2O_3$.

* * * * *